(12) United States Patent
Chen

(10) Patent No.: US 6,764,146 B2
(45) Date of Patent: Jul. 20, 2004

(54) COMPUTER ENCLOSURE WITH PIVOTING OPENING MEANS

(75) Inventor: Yun-Lung Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 69 days.

(21) Appl. No.: 10/113,061

(22) Filed: Mar. 29, 2002

(65) Prior Publication Data

US 2003/0151332 A1 Aug. 14, 2003

(30) Foreign Application Priority Data

Feb. 8, 2002 (TW) ...................................... 91201726 U

(51) Int. Cl.[7] .............................................. H05K 7/18
(52) U.S. Cl. .................................... 312/223.2; 312/325
(58) Field of Search ............................. 312/223.2, 325, 312/326, 327, 328, 329, 139.1, 322, 323; 16/366, 289; 220/817, 345.1

(56) References Cited

U.S. PATENT DOCUMENTS

| | | | | |
|---|---|---|---|---|
| 581,664 A | * | 4/1897 | Martin et al. ..................... | 5/58 |
| 1,988,606 A | * | 1/1935 | Milhening ............... | 206/45.28 |
| 2,131,408 A | * | 9/1938 | Murrer ....................... | 220/533 |
| 4,522,288 A | * | 6/1985 | Wickman et al. ........... | 190/106 |
| 5,339,494 A | * | 8/1994 | Esau et al. ..................... | 16/294 |
| 5,598,318 A | * | 1/1997 | Dewitt et al. ............... | 361/683 |
| 5,995,363 A | * | 11/1999 | Wu ............................ | 361/679 |
| 6,442,801 B1 | * | 9/2002 | Kim ........................... | 16/361 |
| 6,603,655 B2 | * | 8/2003 | Hrehor et al. .............. | 361/683 |
| 2003/0147224 A1 | * | 8/2003 | Chen ......................... | 361/752 |
| 2003/0151334 A1 | * | 8/2003 | Chen et al. .............. | 312/223.2 |

FOREIGN PATENT DOCUMENTS

JP 09177419 * 7/1997

* cited by examiner

Primary Examiner—Janet M. Wilkens
(74) Attorney, Agent, or Firm—Wei Te Chung

(57) ABSTRACT

A computer enclosure includes a base (10), a hood (20), a pair of first locating plates (50), a pair of second locating plates (70), a pair of positioning plates (60), and a pair of connecting mechanisms (40) pivotably connecting the hood to the base. Each connecting mechanism has a first lever (44), a second lever (46), and a horizontal lever (42). One end of each first lever pivotably connects with the corresponding first locating plate. One end of each second lever pivotably and slidably connects in a slot (72) defined in the corresponding second locating plate. Each horizontal lever pivotably connects with the corresponding positioning plate and respective opposite ends of the first and second levers. The positioning plates are secured to opposite sides of the hood. The locking plates are secured to opposite sides of the base. Two locking devices (30) are secured to opposite sides of the hood.

17 Claims, 4 Drawing Sheets

COMPUTER ENCLOSURE WITH PIVOTING OPENING MEANS

BACKGROUND OF THE INVENTION

1. Field of the Invention

The present invention relates to computer enclosures, and more particularly to a computer enclosure having pivoting means so that the enclosure can be readily opened and closed.

2. Related Art

New computer components and accessories are continually being developed. This necessitates regular maintenance, renewal and upgrading of components and fittings of existing computers. Accordingly, a computer enclosure should readily allow access to an interior thereof.

A typical computer enclosure comprises a base, a front bezel, a pair of side panels and a cover, all of which are separate parts. In assembly, the bezel, the side panels and the cover are directly secured to the base with screws. In order to remove the bezel or the cover, the screws must be disengaged from the base one by one. This is unduly laborious and time-consuming.

Taiwan Patent Application No. 89211639 discloses another conventional computer enclosure. The base defines a plurality of slots at opposite sides thereof, and a plurality of holes at a front panel. The bezel inwardly forms a plurality of protrusions and hooks thereon. The cover has a pair of parallel flanges with a plurality of slots defined therein. Each of two side panels forms a plurality of hooks at top and bottom edges thereof. In assembly of the enclosure, the cover is secured to the base with screws. The hooks of the side panels are engaged in the slots of the cover and the slots of the base. Screws enhance engagement of the side panels with the cover and the base. The protrusions and hooks of the bezel are inserted into the holes of the front panel of the base.

To open the enclosure, the screws are detached from the base one by one. The protrusions and hooks of the bezel are disengaged from the holes of the front panel of the base. The hooks of the side panels are disengaged from the slots of the base. Thus, the bezel, the side panels and the cover are detached from the base. This procedure is unduly laborious and time-consuming.

It is strongly desired to provide an improved computer enclosure which overcomes the above-mentioned problems.

BRIEF SUMMARY OF THE INVENTION

Accordingly, an object of the present invention is to provide a computer enclosure which can be readily opened and closed.

In order to achieve the object set out above, a computer enclosure of the present invention comprises a base, a hood, a pair of first locating plates, a pair of second locating plates, a pair of positioning plates, and a pair of connecting mechanisms pivotably connecting the hood to the base. Each connecting mechanism has a first lever, a second lever, and a horizontal lever. One end of each first lever pivotably connects with the corresponding first locating plate. One end of each second lever pivotably and slidably connects in a slot defined in the corresponding second locating plate. Each horizontal lever pivotably connects with the corresponding positioning plate and respective opposite ends of the first and second levers. The positioning plates are secured to opposite sides of the hood. The locking plates are secured to opposite sides of the base. Two locking devices are secured to opposite sides of the hood for securing the hood to the base.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
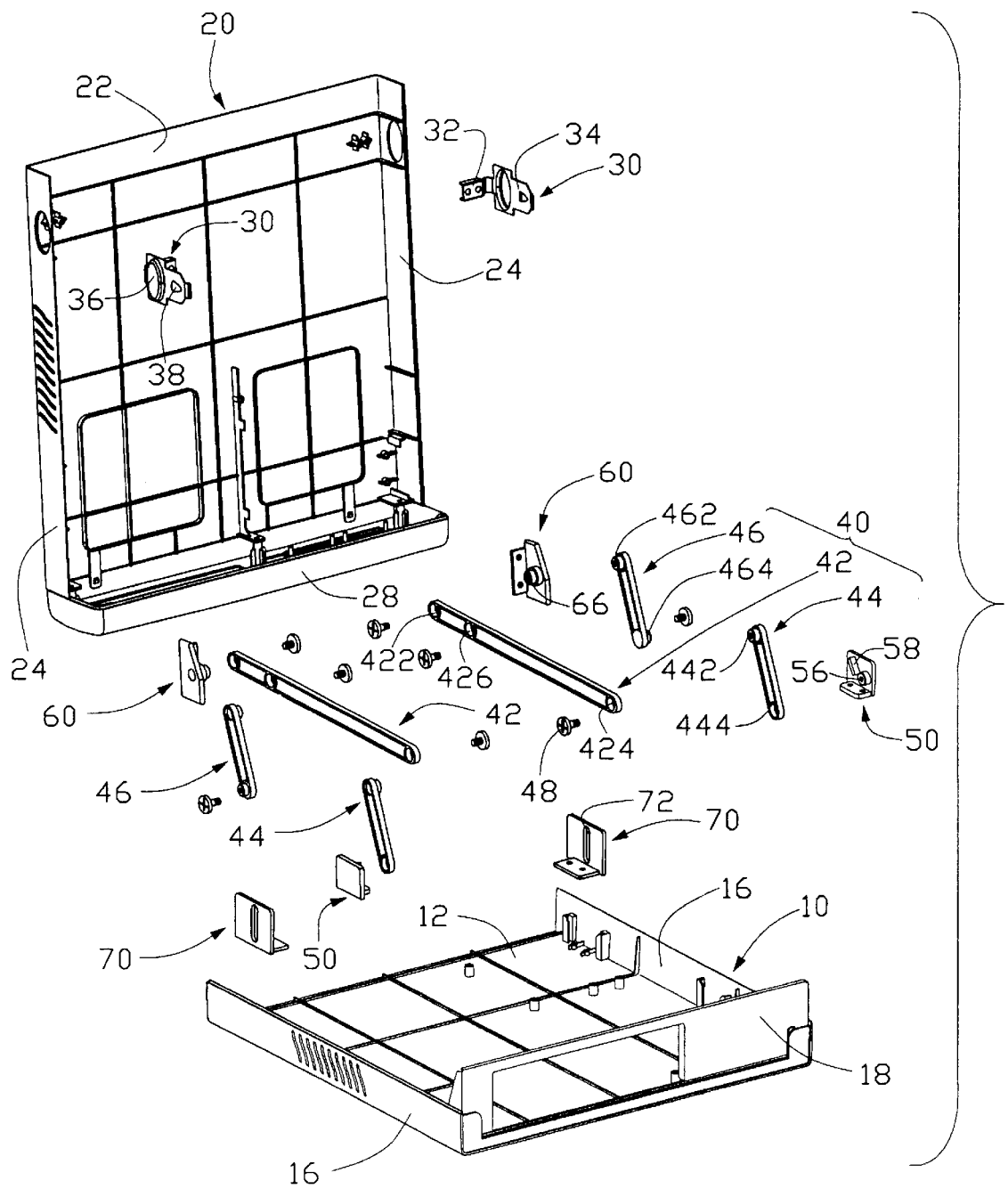
FIG. 1 is an exploded perspective view of a computer enclosure in accordance with a preferred embodiment of the present invention.

Reference will now be made to the drawing figures to describe the present invention in detail.

Referring to FIGS. 1–4, a computer enclosure in accordance with a preferred embodiment of the present invention comprises a rectangular base 10, a hood 20, a pair of first locating plates 50, a pair of second locating plates 70, a pair of positioning plates 60, and a pair of connecting mechanisms 40. The connecting mechanisms 40 are pivotably connected with the base 10 and the hood 40, and cooperate with a pair of locking devices 30 of the hood 20 to facilitate opening and closing of the computer enclosure.

Figure 2:
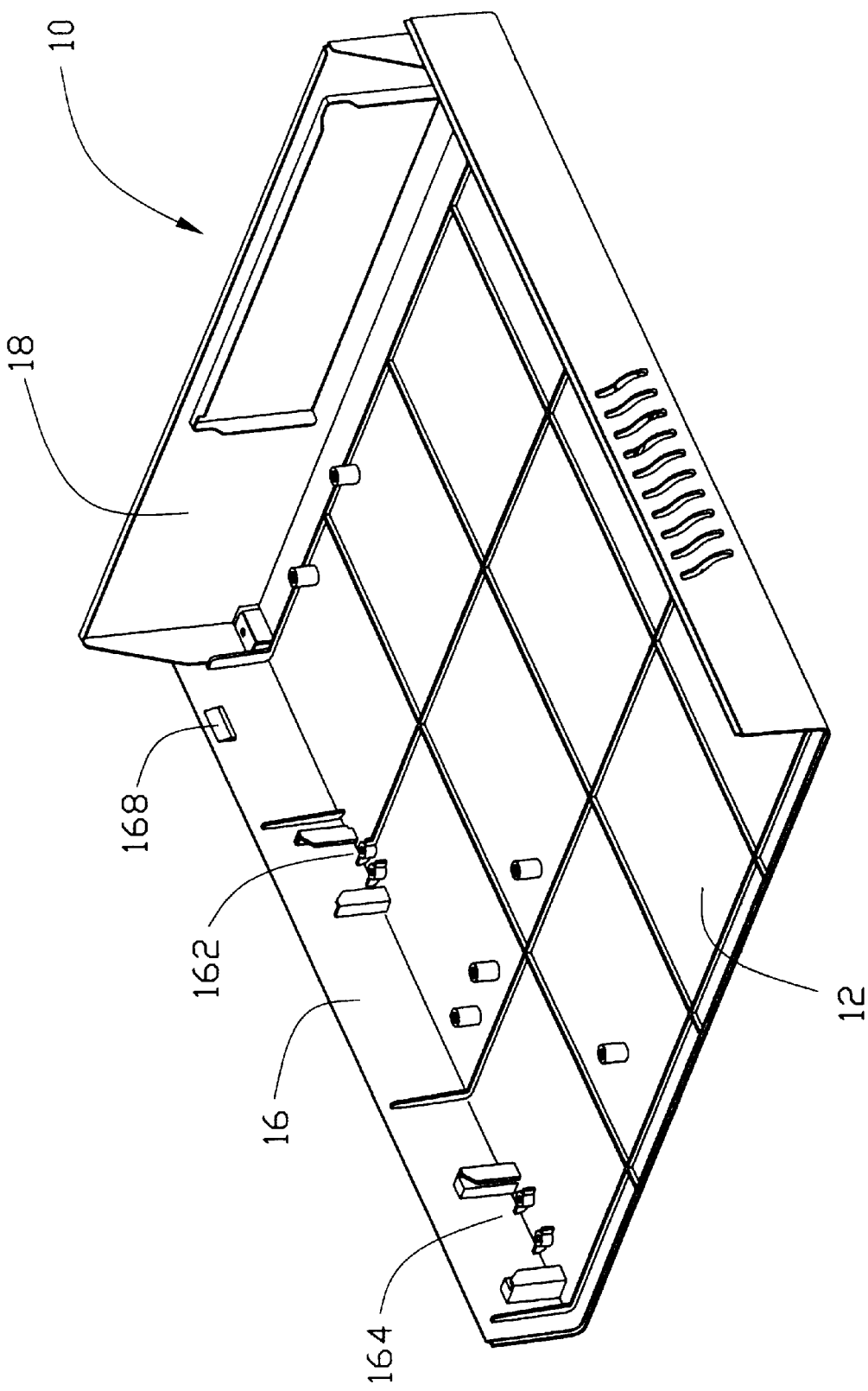
FIG. 2 is an enlarged perspective view of a base of the enclosure of FIG. 1, viewed from another aspect.

Referring particularly to FIG. 2, the base 10 comprises a bottom panel 12, a pair of parallel side panels 16, and a rear panel 18. The side panels 16 and the rear panel 18 all extend upwardly from the bottom panel 12. A first locating mechanism 162 is formed at a generally middle portion of a junction of the bottom panel 12 and each side panel 16. A second locating mechanism 164 is formed at a front portion of the junction of the bottom panel 12 and each side panel 16. A wedge-shaped first protrusion 168 is inwardly formed from each side panel 16 near the rear panel 18.

Figure 3:
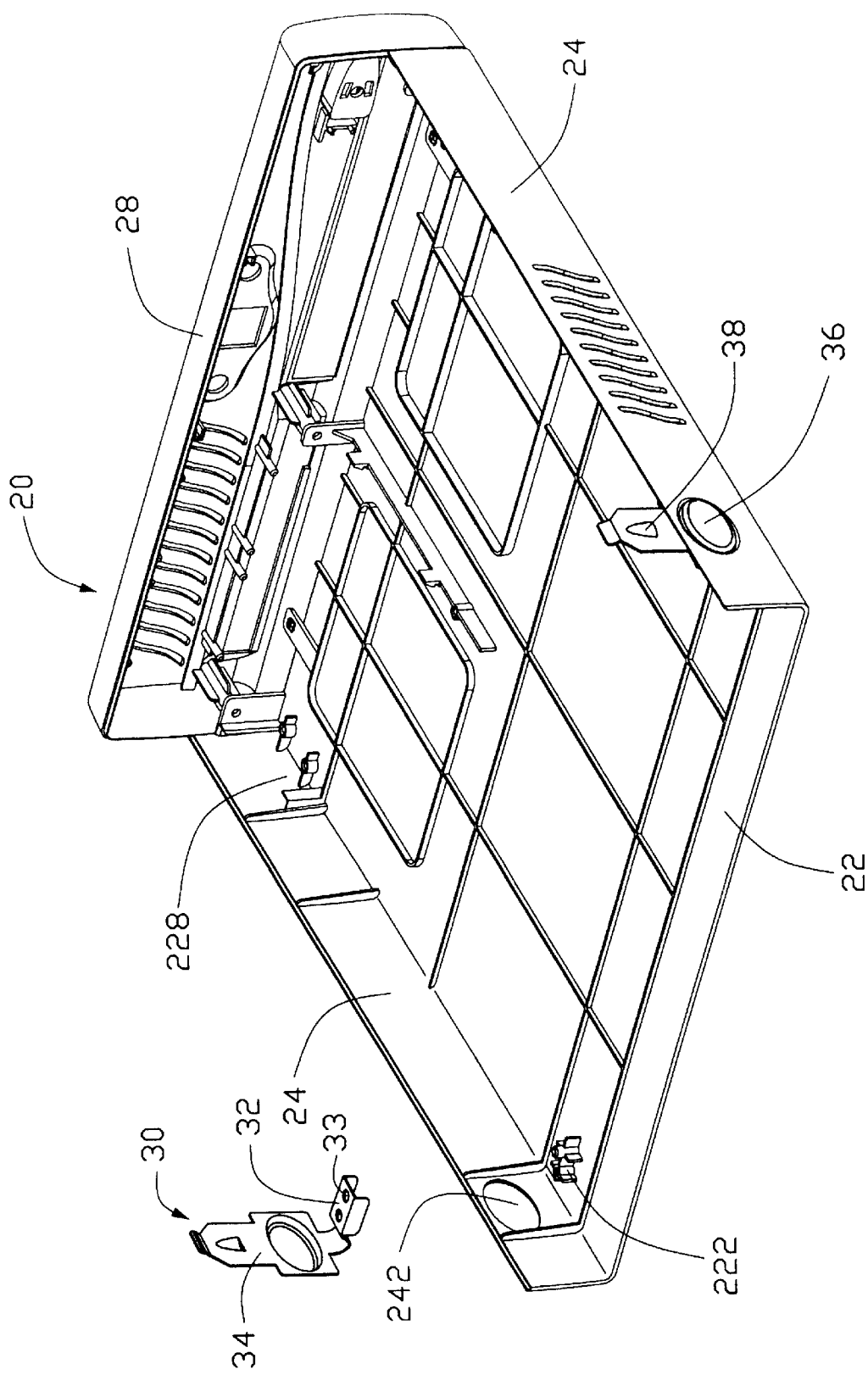
FIG. 3 is an enlarged perspective view of a hood of the enclosure of FIG. 1, viewed with the hood inverted.

Referring particularly to FIG. 3, the hood 20 comprises a top cover 22, a pair of sidewalls 24, a bezel 28, and the pair of locking devices 30. The bezel 28 is attached to an end of the top cover 22, and is generally perpendicular to the top cover 22. A positioning mechanism 228 is formed at a junction of the top cover 22 and each sidewall 24, near the bezel 28. A pair of locating posts 222 is inwardly formed on each of opposite sides of the top cover 22, distal from the bezel 28. A threaded hole (not labeled) is defined in each locating post 222. An opening 242 is defined in each sidewall 24 near the corresponding locating post 222.

Each locking device 30 comprises a fixing portion 32, and an elastic portion 34 extending perpendicularly from the fixing portion 32. A pair of through holes 33 is defined in the fixing portion 32, corresponding to the threaded holes (not labeled) of the corresponding pair of locating posts 222. The elastic portion 34 provides the locking device 30 with resiliency. A button 36 is outwardly stamped from the elastic portion 34, for being received in the opening 242 of the corresponding sidewall 24 of the hood 20. A wedge-shaped second protrusion 38 is outwardly formed from a vicinity of a distal end of the elastic portion 34, for engaging with the corresponding first protrusion 168 of the base 10.

Each of the first and second locating plates 50, 70 has a generally L-shaped profile. The first locating plates 50 are for being secured to the corresponding first locating mechanisms 162 of the base 10. A first pivot 56 is inwardly formed on each first locating plate 50. A slanted stop 58 is inwardly formed beside the first pivot 56, distal from the rear panel 18 of the base 10. The second locating plates 70 are for being secured to the corresponding second locating mechanisms 164 of the base 10. A vertical slot 72 is defined in each second locating plate 70.

Each positioning plate 60 has a generally L-shaped profile. The positioning plate 60 is for being secured to the corresponding positioning mechanism 228 of the hood 20. A second pivot 66 is inwardly formed on the positioning plate 60.

Each connecting mechanism 40 comprises a pair of parallel first and second levers 44, 46, a horizontal lever 42, and a plurality of screws 48. A first pivot hole 444 is defined in a bottom end of the first lever 44, corresponding to the pivot 56 of the locating plate 50. A second pivot hole 422 is defined in a front end of the horizontal lever 42, corresponding to the second pivot 66 of the positioning plate 60. A third pivot 442 is inwardly formed at a top end of the first lever 44, corresponding to a third pivot hole 424 that is defined in a rear end of the horizontal lever 42. A fourth pivot 462 is inwardly formed at a top end of the second lever 46, corresponding to a fourth pivot hole 426 that is defined in the horizontal lever 42 between the second and third pivot holes 422, 424. A fifth pivot 464 is outwardly formed at a bottom end of the second lever 46, corresponding to the slot 72 of the corresponding second locating plate 70.

Figure 4:
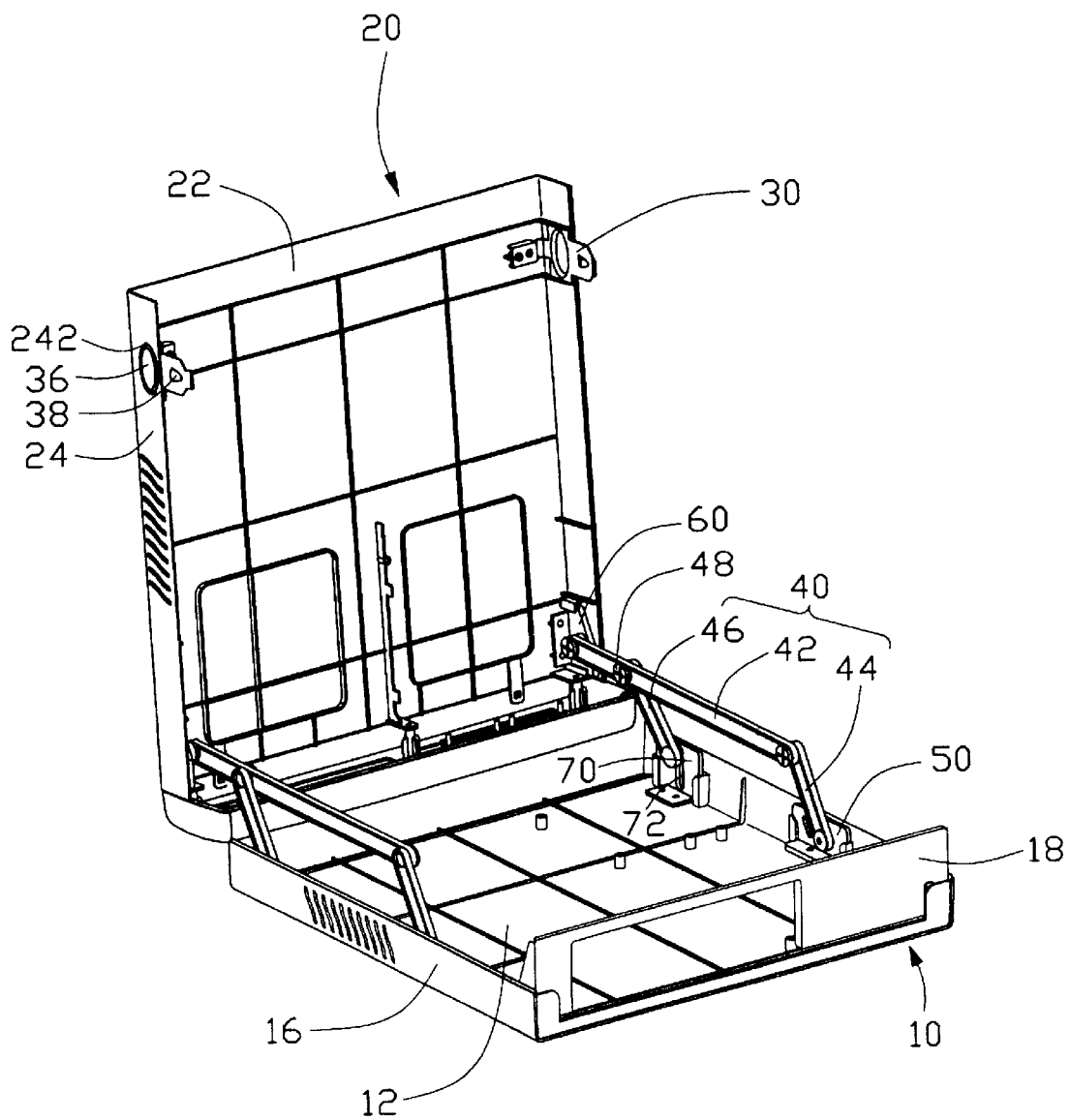
FIG. 4 is an assembled view of FIG. 1.

FIG. 4 shows the computer enclosure fully assembled. For brevity, assembly of only one of the connecting mechanisms 40 and associated components is described herebelow. The first pivot 56 of the first locating plate 50 is pivotably received in the first pivot hole 444 of the first lever 44 using one screw 48. The first locating plate 50 is secured to the first locating mechanism 162 of the base 10 by conventional means. The third pivot 442 of the first lever 44 is pivotably received in the third pivot hole 424 of the horizontal lever 42 using another screw 48. The fifth pivot 464 of the second lever 46 is slidably and pivotably received in the slot 72 of the second locating plate 70 using another screw 48. The second locating plate 70 is secured to the second locating mechanism 164 of the base 10 by conventional means. The fourth pivot 462 of the second lever 46 is pivotably received in the fourth pivot hole 426 of the horizontal lever 42 using another screw 48. The second pivot 66 of the positioning plate 60 is pivotably received in the second pivot hole 422 of the horizontal lever 42 using another screw 48. The positioning plate 60 is secured to the positioning mechanism 228 of the hood 20 by conventional means.

Two bolts (not shown) are respectively extended through the through holes 33 of the fixing portions 32 of each locking device 30, to engage in the threaded holes (not labeled) of the corresponding locating posts 222 of the hood 20. The locking devices 30 are thus secured to the hood 20. The buttons 36 of the locking devices 30 are received in the openings 242 of the hood 20. When the hood 20 is pivoted downwardly to cover the base 10, the fifth pivots 464 of the second levers 46 pivotingly slide along the slots 72 of the second locating plates 70. This enhances smooth movement of the connecting mechanisms 40 relative to the base 10 and the hood 20. When the computer enclosure is closed, the second protrusions 38 of the locking devices 30 are snappingly engaged with the first protrusions 168 of the base 10. Thus, the hood 20 is pivotably locked to the base 10 by the connecting mechanisms 40.

To open the computer enclosure, the buttons 36 of the locking devices 30 are pushed inwardly. The second protrusions 38 of the locking devices 30 are thus released from the first protrusions 168 of the base 10. The hood 20 is lifted up. The fifth pivots 464 of the second levers 46 pivotingly slide along the slots 70 of the second locating plates 70. The hood 20 is rotated upwardly and forwardly away from the base 10, until the first levers 44 of the connecting mechanisms 40 are blocked by the corresponding slanted stops 58 of the locating plates 50.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A computer enclosure comprising:
    a base comprising a bottom panel and two opposite side panels;
    a hood comprising a cover and two opposite side walls;
    a pair of opposing first locating plates secured to the base;
    a pair of opposing second locating plates secured to the base, the second locating plates being spaced from the first locating plates;
    a pair of opposing positioning plates secured to the hood; and
    a pair of connecting mechanisms pivotably connecting the hood to the base, each of the connecting mechanisms comprising a first lever, a second lever and a third lever, wherein a lower end of the first lever is pivotably connected with the first locating plate, a lower end of the second lever is pivotably and slidably connected with the second locating plate, upper portions of the first and second levers are respectively pivotably connected with the third lever, and the third lever is pivotably connected with a corresponding positioning plate.

2. The computer enclosure as described in claim 1, wherein a pair of opposing first locating mechanisms is formed at junctions of the bottom panel and the side panels of the base, the first locating plates are secured to the first locating mechanisms, a pair of opposing second locating mechanisms is formed at junctions of the bottom panel and the side panels of the base, the second locating mechanisms are spaced from the first locating mechanisms, and the second locating plates are secured to the second locating mechanisms.

3. The computer enclosure as described in claim 1, wherein a pair of positioning mechanisms is formed at junctions of the cover and the sidewalls of the hood, and the positioning plates are secured to the positioning mechanisms.

4. The computer enclosure as described in claim 1, wherein each of the first locating plates forms a pivot pivotably received in a pivot hole defined in a corresponding first lever.

5. The computer enclosure as described in claim 1, wherein each of the second levers forms a pivot slidably and pivotably received in a slot defined in a corresponding second locating plate.

6. The computer enclosure as described in claim 5, wherein the slot is generally vertical.

7. The computer enclosure as described in claim 1, wherein a pivot is formed on each of the positioning plates, each of the first levers and each of the second levers, and each said pivot is pivotably received in a corresponding one of three pivot holes defined in a corresponding third lever.

8. The computer enclosure as described in claim 1, wherein a stop is formed on each of the first locating plates, for blocking a corresponding first lever.

9. The computer enclosure as described in claim 1, wherein a pair of locking devices is secured to opposite sides of the cover, for locking the hood to the base.

10. The computer enclosure as described in claim 9, wherein a first protrusion is formed on each of the locking devices, and the first protrusion snappingly engages with a corresponding second protrusion formed on the base when the enclosure is closed.

11. The computer enclosure as described in claim 10, wherein a button is formed on each of the locking devices, the button is received in an opening defined in a corresponding side panel of the base when the enclosure is closed, and when the button is pressed, the first protrusion is released from the corresponding second protrusion.

12. A computer enclosure comprising:

a base comprising a bottom panel and two opposite side panels;

a hood comprising a cover and two opposite side walls; and a connecting mechanism pivotably connecting the hood to the base, the connecting mechanism comprising two pivoting levers and a connecting lever, one end of the connecting lever being pivotably connected to the hood, one end of each of the pivoting levers being pivotably connected to the connecting lever, an opposite end of each of the pivoting levers being pivotably connected to the base, wherein at least one of said opposite ends of the pivoting levers is also slidably connected to the base.

13. The computer enclosure as described in claim 12, wherein a plurality of locating plates is secured to the base, and the locating plates pivotably connect the pivoting levers thereto.

14. The computer enclosure as described in claim 13, wherein at least one of the locating plates defines a slot therein, and the slot slidably receives said opposite end of a corresponding pivoting lever.

15. The computer enclosure as described in claim 12, wherein a positioning plate is secured to the hood, and the positioning plate pivotably connects said one end of the connecting lever thereto.

16. The computer enclosure as described in claim 12, wherein at least one locking device is secured to the hood, for locking the hood to the base.

17. A computer enclosure comprising:

a base comprising at least one side panel;

a hood comprising at least one side wall closely aligned with said side panel in a vertical plane;

a connecting mechanism pivotably connecting said hood to the base, said connecting mechanism including a four-bar-linkage structure mounted around the side panel, said four-bar-linkage structure essentially comprising front and rear short levers connected by a long bar at ends thereof, said bar further extending beyond a joint portion with the rear short lever and pivotally connected around a rear portion of the side wall, said rear short lever is moveable along a slot while the front short lever has a stationary pivot point with regard to the base;

wherein when in a locked position the hood is configured to basically somewhat horizontally rearwardly move, via said four-bar-linkage structure, relative to the base with a distance to allow a rear bezel of said hood to be spaced from a rear portion of the base with sufficient space and successively to be rearwardly rotated via a pivot structure between the bar and the hood without interference between the bezel and the base.

* * * * *